US007956762B2

(12) United States Patent
Bailey et al.

(10) Patent No.: US 7,956,762 B2
(45) Date of Patent: Jun. 7, 2011

(54) METHOD AND APPARATUS FOR POWER GENERATION FAILURE DIAGNOSTICS

(75) Inventors: Bradley Bailey, Peoria, IL (US); Matthew Hendrickson, Peoria, IL (US); Frederick Beach, East Peoria, IL (US)

(73) Assignee: Caterpillar Inc., Peoria, IL (US)

( * ) Notice: Subject to any disclaimer, the term of this patent is extended or adjusted under 35 U.S.C. 154(b) by 339 days.

(21) Appl. No.: 12/210,898

(22) Filed: Sep. 15, 2008

(65) Prior Publication Data

US 2010/0066551 A1 Mar. 18, 2010

(51) Int. Cl.
*G08B 21/00* (2006.01)

(52) U.S. Cl. .................. 340/648; 340/691.6; 340/693.4; 340/5.32

(58) Field of Classification Search .................. 340/648, 340/660, 662–664, 679–680, 685, 691.6, 340/693.4, 3.32, 3.43, 3.42, 825.23, 5.32
See application file for complete search history.

(56) References Cited

U.S. PATENT DOCUMENTS

| | | | |
|---|---|---|---|
| 2,279,407 A | 8/1942 | McCune | |
| 2,409,099 A | 10/1946 | Bloomfield | |
| 2,482,840 A | 9/1949 | Collins et al. | |
| 2,520,204 A | 8/1950 | Hancock | |
| 3,216,769 A | 11/1965 | Hicks et al. | |
| 3,250,973 A | 5/1966 | Dawson | |
| 3,259,216 A | 7/1966 | Klaus et al. | |
| 3,370,218 A | 2/1968 | Merz | |
| 3,410,375 A | 11/1968 | Schmidt | |
| 3,495,404 A | 2/1970 | Thompson | |
| 3,562,565 A | 2/1971 | Higashino | |
| 3,670,854 A | 6/1972 | Maci | |
| 3,696,893 A | 10/1972 | Koivunen | |
| 3,730,596 A | 5/1973 | Felix et al. | |
| 3,774,095 A | 11/1973 | Coccia | |
| 3,944,287 A | 3/1976 | Nagase | |
| 3,964,458 A * | 6/1976 | Strauss et al. ................. | 123/552 |
| 3,992,062 A | 11/1976 | Jeffrey et al. | |
| 4,031,440 A | 6/1977 | Christian et al. | |
| 4,054,821 A | 10/1977 | Williamson | |
| 4,083,469 A | 4/1978 | Schexnayder | |
| 4,143,280 A | 3/1979 | Kuehn, Jr. et al. | |
| 4,181,366 A | 1/1980 | Dobner | |
| 4,270,806 A | 6/1981 | Venkataperumal et al. | |
| 4,280,073 A | 7/1981 | Miller | |
| 4,292,531 A | 9/1981 | Williamson | |
| 4,313,517 A | 2/1982 | Pivar | |
| 4,469,954 A * | 9/1984 | Maehara ....................... | 290/1 A |
| 4,482,813 A | 11/1984 | Grand-Perret et al. | |
| 4,495,449 A | 1/1985 | Black et al. | |
| 4,651,071 A | 3/1987 | Imanaka | |
| 4,659,149 A | 4/1987 | Rumsey et al. | |
| 4,671,577 A | 6/1987 | Woods | |
| 4,698,561 A | 10/1987 | Buchanan et al. | |
| 4,772,829 A | 9/1988 | Pickering et al. | |
| 4,938,321 A | 7/1990 | Kelley et al. | |

(Continued)

*Primary Examiner* — Daniel Previl

(74) *Attorney, Agent, or Firm* — Leydig, Voit & Mayer

(57) ABSTRACT

A controller (500) in an electric drive system is used to develop power generation failure diagnostics. During operation, the controller (500) receives a set of generator inputs, a set of machine parameters, and a set of diagnostic values. Next, the controller (500) determines a set of expected operating values corresponding to the set of diagnostic values. The controller (500) then compares the obtained diagnostic values to one or more corresponding expected operating values. If the difference is greater than a threshold, the controller (500) provides an appropriate fault indication.

17 Claims, 6 Drawing Sheets

U.S. PATENT DOCUMENTS

| | | | |
|---|---|---|---|
| 4,952,817 A * | 8/1990 | Bolan et al. | 307/39 |
| 4,962,969 A | 10/1990 | Davis | |
| 4,965,513 A | 10/1990 | Haynes et al. | |
| 5,103,923 A | 4/1992 | Johnston et al. | |
| 5,139,121 A | 8/1992 | Kumura et al. | |
| 5,222,787 A | 6/1993 | Eddy et al. | |
| 5,280,223 A | 1/1994 | Grabowski et al. | |
| 5,293,966 A | 3/1994 | Chareire | |
| 5,302,008 A | 4/1994 | Miyake et al. | |
| 5,322,147 A | 6/1994 | Clemens | |
| 5,323,095 A | 6/1994 | Kumar | |
| 5,351,775 A | 10/1994 | Johnston et al. | |
| 5,355,978 A | 10/1994 | Price et al. | |
| 5,362,135 A | 11/1994 | Riddiford et al. | |
| 5,378,053 A | 1/1995 | Patient et al. | |
| 5,432,413 A | 7/1995 | Duke et al. | |
| 5,450,324 A | 9/1995 | Cikanek | |
| 5,469,943 A | 11/1995 | Hill et al. | |
| 5,472,264 A | 12/1995 | Klein et al. | |
| 5,476,310 A | 12/1995 | Ohtsu et al. | |
| 5,492,192 A | 2/1996 | Brooks et al. | |
| 5,511,859 A | 4/1996 | Kade et al. | |
| 5,523,701 A | 6/1996 | Smith et al. | |
| 5,539,641 A | 7/1996 | Littlejohn | |
| 5,551,764 A | 9/1996 | Kircher et al. | |
| 5,573,312 A | 11/1996 | Müller et al. | |
| 5,615,933 A | 4/1997 | Kidston et al. | |
| 5,632,534 A | 5/1997 | Knechtges | |
| 5,707,115 A | 1/1998 | Bodie et al. | |
| 5,754,450 A | 5/1998 | Solomon et al. | |
| 5,755,302 A | 5/1998 | Lutz et al. | |
| 5,769,509 A | 6/1998 | Feigel et al. | |
| 5,775,784 A | 7/1998 | Koga et al. | |
| 5,832,395 A | 11/1998 | Takeda et al. | |
| 5,839,800 A | 11/1998 | Koga et al. | |
| 5,853,229 A | 12/1998 | Willmann et al. | |
| 5,951,115 A | 9/1999 | Sakai et al. | |
| 5,961,190 A | 10/1999 | Brandmeier et al. | |
| 5,962,997 A | 10/1999 | Maisch | |
| 5,983,149 A | 11/1999 | Tate et al. | |
| 6,076,899 A | 6/2000 | Isella | |
| 6,078,173 A | 6/2000 | Kumar et al. | |
| 6,087,791 A | 7/2000 | Maruyama | |
| 6,120,115 A | 9/2000 | Manabe | |
| 6,158,822 A | 12/2000 | Shirai et al. | |
| 6,213,567 B1 | 4/2001 | Zittlau et al. | |
| 6,226,586 B1 | 5/2001 | Luckevich et al. | |
| 6,231,134 B1 | 5/2001 | Fukasawa et al. | |
| 6,242,873 B1 | 6/2001 | Drozdz et al. | |
| 6,318,487 B2 | 11/2001 | Yanase et al. | |
| 6,325,470 B1 | 12/2001 | Schneider | |
| 6,392,418 B1 | 5/2002 | Mir et al. | |
| 6,425,643 B2 | 7/2002 | Shirai et al. | |
| 6,441,573 B1 | 8/2002 | Zuber et al. | |
| 6,456,909 B1 | 9/2002 | Shimada et al. | |
| 6,457,784 B1 | 10/2002 | Böhm et al. | |
| 6,488,344 B2 | 12/2002 | Huls et al. | |
| 6,547,343 B1 | 4/2003 | Hac | |
| 6,560,515 B2 | 5/2003 | Inoue | |
| 6,663,197 B2 | 12/2003 | Joyce | |
| 6,664,653 B1 | 12/2003 | Edelman | |
| 6,687,593 B1 | 2/2004 | Crombez et al. | |
| 6,709,075 B1 | 3/2004 | Crombez et al. | |
| 6,724,165 B2 | 4/2004 | Hughes | |
| 6,771,040 B2 | 8/2004 | Kusumoto | |
| 6,815,933 B2 | 11/2004 | Taniguchi et al. | |
| 6,885,920 B2 | 4/2005 | Yakes et al. | |
| 6,910,747 B2 | 6/2005 | Tsunehara | |
| 6,933,692 B2 | 8/2005 | Gabriel et al. | |
| 6,959,971 B2 | 11/2005 | Tsunehara | |
| 6,986,727 B2 | 1/2006 | Kuras et al. | |
| 7,029,077 B2 | 4/2006 | Anwar et al. | |
| 7,059,691 B2 | 6/2006 | Tsunehara et al. | |
| 7,104,617 B2 | 9/2006 | Brown | |
| 7,136,737 B2 | 11/2006 | Ashizawa et al. | |
| 7,290,840 B2 | 11/2007 | Tsunehara et al. | |
| 7,308,352 B2 | 12/2007 | Wang et al. | |
| 7,311,163 B2 | 12/2007 | Oliver | |
| 7,330,012 B2 | 2/2008 | Ahmad et al. | |
| 7,378,808 B2 | 5/2008 | Kuras et al. | |
| 7,385,372 B2 | 6/2008 | Ahmad et al. | |
| 7,486,099 B1 * | 2/2009 | Manika | 324/768 |
| 2001/0024062 A1 | 9/2001 | Yoshino | |
| 2002/0043962 A1 | 4/2002 | Taniguchi et al. | |
| 2002/0050739 A1 | 5/2002 | Koepff et al. | |
| 2002/0117984 A1 | 8/2002 | Zuber et al. | |
| 2003/0132039 A1 | 7/2003 | Gaffney et al. | |
| 2003/0149521 A1 | 8/2003 | Minowa et al. | |
| 2003/0151387 A1 | 8/2003 | Kumar | |
| 2003/0169002 A1 | 9/2003 | Hughes | |
| 2004/0090116 A1 | 5/2004 | Tsunehara | |
| 2004/0108789 A1 | 6/2004 | Marshall | |
| 2004/0239180 A1 | 12/2004 | Foust | |
| 2004/0251095 A1 | 12/2004 | Simard et al. | |
| 2005/0099146 A1 | 5/2005 | Nishikawa et al. | |
| 2005/0284676 A1 * | 12/2005 | King et al. | 180/65.3 |
| 2006/0047400 A1 | 3/2006 | Prakash et al. | |
| 2006/0055240 A1 | 3/2006 | Toyota et al. | |
| 2006/0086547 A1 | 4/2006 | Shimada et al. | |
| 2006/0089777 A1 | 4/2006 | Riddiford et al. | |
| 2006/0102394 A1 * | 5/2006 | Oliver | 180/65.2 |
| 2007/0016340 A1 | 1/2007 | Soudier et al. | |
| 2007/0145918 A1 | 6/2007 | Kumar et al. | |
| 2007/0182359 A1 | 8/2007 | Wahler | |
| 2007/0233326 A1 * | 10/2007 | Jayachandran | 701/1 |
| 2008/0084229 A1 | 4/2008 | Frommer et al. | |
| 2009/0140745 A1 * | 6/2009 | Williams et al. | 324/522 |

* cited by examiner

METHOD AND APPARATUS FOR POWER GENERATION FAILURE DIAGNOSTICS

TECHNICAL FIELD

This patent disclosure relates generally to testing electrical systems and components within a machine and, more particularly to a method and apparatus for determining an operating condition of power generation components in an electric drive system.

BACKGROUND

Heavy machinery, such as off-highway trucking equipment, is commonly used in mining, heavy construction, quarrying, and other applications. Due to the substantial capital investment involved, tight tolerances with respect to the time allotted for completing tasks, and the expense of maintaining and operating heavy machinery, such as a mining truck, an entity can suffer significant monetary losses when the heavy machinery malfunctions. The complexity of modern heavy machinery often exacerbates this problem due to the need for skilled personnel to perform various tests on such machinery to trouble shoot such malfunctions. Even so, significant time is often spent locating the fault and then performing an appropriate repair.

One advance that has improved efficiency associated with the use of heavy machinery is the adoption of Alternating Current (AC) or electric drive systems. Electric drive systems typically require less maintenance and thus, have lower life cycle costs. When the heavy machinery malfunctions, however, the costs associated with determining the fault location and effecting a suitable repair are often substantial.

Direct series electric drive systems for machines typically include a power circuit that selectively activates one or more drive motors at a desired torque. Each of the drive motors is connected to a wheel or other traction device that operates to propel the machine. A direct series drive system also includes a prime mover, for example, an internal combustion engine, that drives a power generator. The power generator produces electrical power that is often conditioned by a power circuit, and ultimately used to drive the motor. Conceptually, as the machine is propelled, mechanical power produced by the engine is converted into electrical power by the generator. This electrical power may be processed and/or conditioned by the power circuit before it is metered to the motors. The motors transform the electrical power back into mechanical power that drives the wheel and propels the machine.

The failure of power generation components, that is the components of the power generator disposed between the engine and other portions of the power circuit, may occur due to constant rotation or proximity to moving components. If not detected early, such failures may result in additional fault conditions. These conditions are often difficult to troubleshoot. This may ultimately lead to longer down-times of the machine. Often, various systems and subsystems of the machine must be examined by skilled personnel to in order to detect the malfunction condition or conditions. This requires that the operator shutdown the machine and remove it from service.

SUMMARY

The disclosure describes, in one aspect, a method for diagnosing a power generation failure for a power circuit in an electric drive. The electric drive, in this case, is coupled with a prime mover. The power circuit includes a rectifier circuit coupled with a power generator and disposed to provide a DC output voltage across a DC link. The method receives at lease one power generator input and at least one machine parameter associated with the prime mover. In addition, the method receives a set of diagnostic values associated with the DC link and the at least one power generator input. Based on the at least one power generator input and the at least one machine parameter, the method determines a set of expected operating values corresponding to the received set of diagnostic values. The method then compares each diagnostic value from the set of diagnostic values to a corresponding expected operating value from the set of expected operating values and determines a difference for each diagnostic value. The method sets an indicator flag that a power generation failure exists if the difference between one or more diagnostic values and a corresponding one or more expected values exceeds a threshold.

In another aspect, the disclosure describes a controller configured to monitor whether a power generation failure has occurred in a power circuit of an electric drive system. The electric drive system is disposed in a machine that includes a prime mover that provides an output to a power generator, which part of the power circuit. The power circuit also includes a rectifier circuit coupled with the output of the power generator, and a direct current (DC) link disposed in circuit with the rectifier. The controller comprises an input receiving portion configured to receive a set of diagnostic values relating to engine parameters associated with the prime mover, a set of diagnostic values associated with the power generator inputs, and a set of diagnostic values associated with the DC link. The controller also includes a determination portion configured to determine, based on the set of power generator inputs and the set of machine parameters, a set of expected operating values corresponding to the set of diagnostic value. In addition, the controller includes a comparison portion configured to compare each of the diagnostic values for the set of diagnostic values to a corresponding expected operating value from the set of expected operating values to determine a set of differences. A logic portion of the controller is configured to determine whether a power generation failure condition has occurred based on the set of differences. An indicator portion of the controller is configured to set a flag when the power generation failure has been determined.

In yet another aspect, the disclosure describes a system including a power generator associated with an electric drive system in a machine. In this instance, the machine includes a prime mover disposed to provide an output coupled with the power generator. The system comprises a rectifier circuit coupled to an output of the power generator. A DC link is coupled to the rectifier circuit and provides a DC link voltage between a first DC rail and a second DC rail. In addition, a controller is configured to receive a set of generator inputs, a set of machine parameters associated with the machine, and a set of diagnostic values associated with the power generator and the DC link. The controller is further configured to determine a set of expected operating values for the power generator and of the DC link and to compare the set of diagnostic values with the set of expected values. The controller sets a flag indicating a power generation failure condition when the comparison exceeds a threshold.

DETAILED DESCRIPTION

This disclosure relates to systems and methods for determining power generation failure in an electric drive machine or vehicle. The disclosure that follows uses an example of a direct series electric drive system having an engine connected to a generator for producing electrical power that drives the vehicle. In the exemplary embodiments presented, the power generator associated with the machine is a multi-phase alternating current (AC) synchronous brushless generator having a rotating input coupled with the output of the engine. The generator includes a rotating rectifier assembly including three rotating diode pairs, and using a wye (Y) configuration for the windings. The systems and methods disclosed herein, however, also have applicability to other electric drive vehicles. For example, the generator associated with the machine or vehicle could use a delta (Δ) configuration for the windings.

Figure 1A:
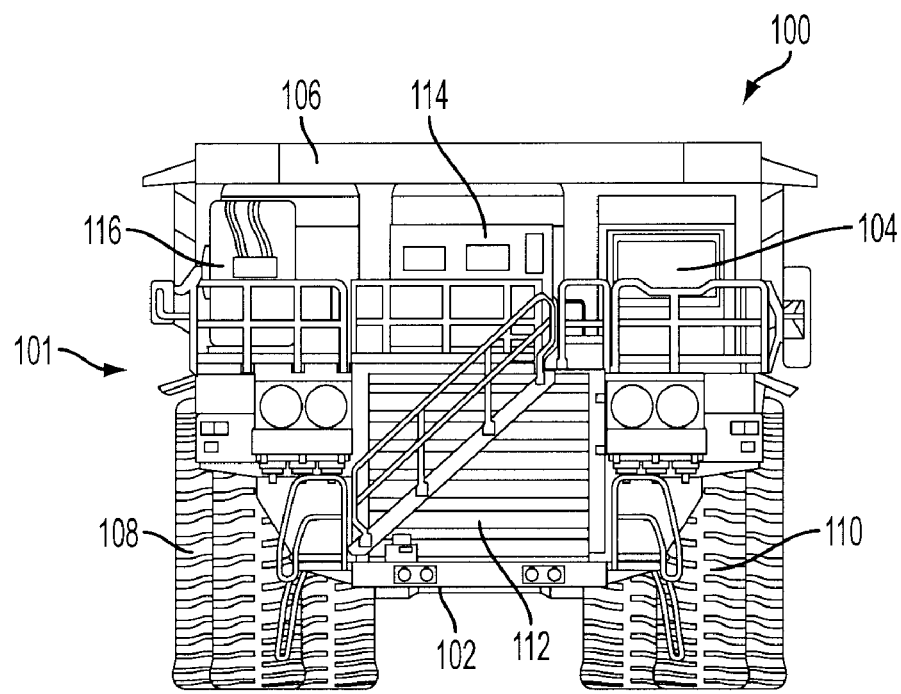
FIGS. 1A and 1B are, respectively, a front view and a side view of a machine in accordance with the disclosure.
Figure 1B:
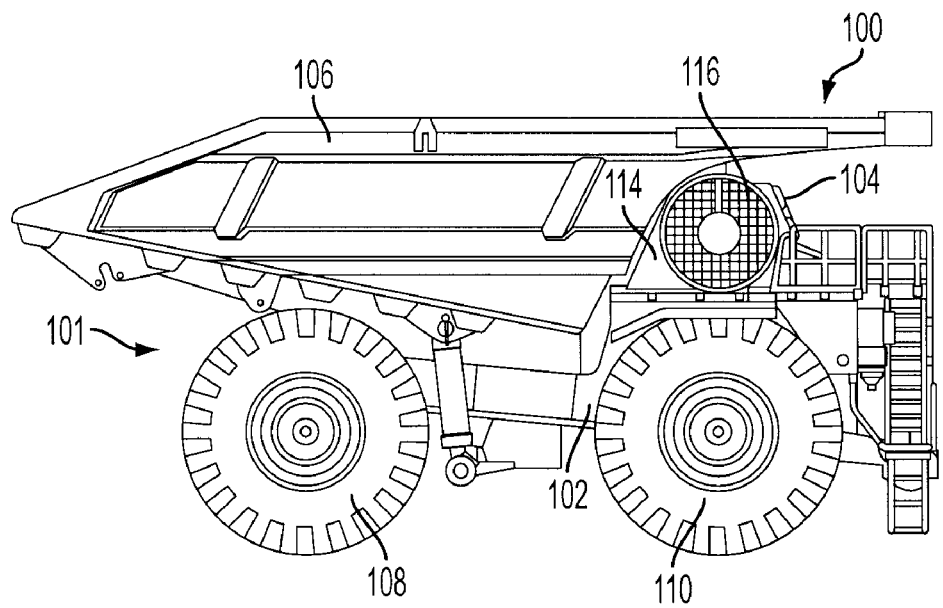

FIG. 1A and FIG. 1B illustrate, respectively, a front and a side view of a machine 100. The machine 100 is a direct series electric drive machine. One example of the machine 100 is an off-highway truck 101 such as those used for construction, mining, or quarrying. In the description that follows, this example illustrates the various arrangements that can be used on machines having direct series electric drive systems. As can be appreciated, any other vehicle having a direct series electric drive or electric-only arrangement can benefit from the advantages described herein. The term "machine," therefore, is used to generically describe any machine having at least one drive wheel that is driven by a motor connected to the wheel. Electrical power may be generated onboard by a generator, alternator, or another power-generation device, which may be driven by an engine or other prime mover. Alternatively, electrical power may be stored but not generated on-board.

A front view of the off-highway truck 101 is shown in FIG. 1A, and a side view is shown in FIG. 1B. The off-highway truck 101 includes a chassis 102 that supports an operator cab 104 and a bucket 106. The bucket 106 is pivotally connected to the chassis 102 and is arranged to carry a payload when the off-highway truck 101 is in service. An operator occupying the operator cab 104 can control the motion and the various functions of the off-highway truck 101. The chassis 102 supports various drive system components. These drive system components are capable of driving a set of drive wheels 108 to propel the off-highway truck 101. A set of idle wheels 110 can steer such that the off-highway truck 101 can move in any direction. Even though the off-highway truck 101 includes a rigid chassis with powered wheels for motion and steerable wheels for steering, one can appreciate that other machine configurations can be used. For example, such configurations may include articulated chassis with one or more driven wheels.

Figure 2:
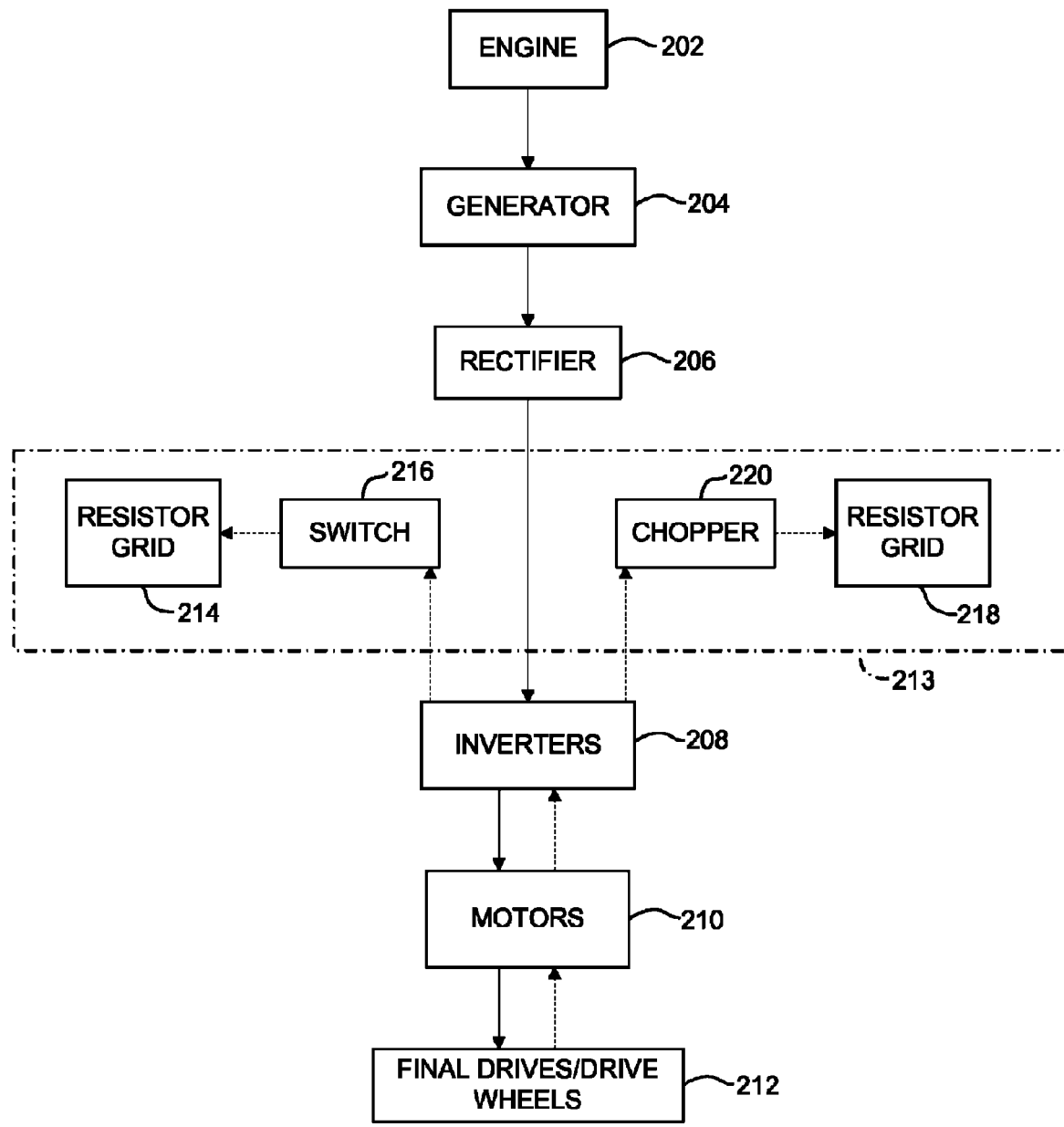
FIG. 2 is a block diagram of a direct series electric drive system for a machine in accordance with the disclosure.

The off-highway truck 101 is a direct series electric drive machine, which in this instance refers to the use of more than one source or form of power to drive the drive wheels 108. A block diagram for the direct series electric drive system of the machine 100, for example, the off-highway truck 101, is shown in FIG. 2. In the block diagram, the flow direction of power in the system when the machine is propelled is denoted by solid-lined arrows. Conversely, the flow of power during a retarding mode is shown in dash-lined arrows. The direct series electric drive system includes an engine 202, for example, an internal combustion engine such as a diesel engine, which produces an output torque at an output shaft (not shown). The output shaft of the engine 202 is connected to a generator 204. In operation, the output shaft of the engine 202 rotates a rotor of the generator 204 to produce electrical power, for example, in the form of alternating current (AC) power. This electrical power is supplied to a rectifier 206 and converted to direct current (DC) power. The rectified DC power may be converted again to an AC power by an inverter circuit 208. The inverter circuit 208 may be capable of selectively adjusting the frequency and/or pulse-width of its output, such that motors 210 that are connected to an output of the inverter circuit 208 may be operated at variable speeds. The motors 210 may be connected via final assemblies (not shown) or directly to drive wheels 212 of the machine 100.

When the off-highway truck 101 is propelled, the engine 202 generates mechanical power that is transformed into electrical power, which is conditioned by various electrical components. In an illustrated embodiment, such components are housed within a cabinet 114 (FIG. 1A). The cabinet 114 is disposed on a platform that is adjacent to the operator cab 104 and may include the rectifier 206 (FIG. 2), inverter circuit 208 (FIG. 2), and/or other components. When the off-highway truck 101 is to be decelerated or its motion is otherwise to be retarded, for example, to prevent acceleration of the machine when travelling down an incline, its kinetic energy is converted to electrical energy. Effective disposition of this generated electrical power enables effective retarding of the off-highway truck 101.

Specifically, when the machine 100 is retarding, the kinetic energy of the machine 100 is transferred into rotational power of the drive wheels that rotates the motors 210, which act as electrical generators. The electrical power generated by the motors 210 has an AC waveform. Because the inverter circuit 208 is a bridge inverter, power supplied by the motors 210 is rectified by the inverter circuit 208 into DC power. Dissipation of the DC power generated by the motors 210 produces a counter-rotational torque at the drive wheels 108 to decelerate the machine. Dissipation of this DC power may be accomplished by passing the generated current rectified by the inverter circuit 208 through a resistance. To accomplish this, a retarder arrangement 213 may include a first resistor grid 214, described in greater detail below, that is arranged to receive current from the inverter circuit 208 via a switch 216. When the switch 216 is closed, the electrical power corresponding to the current generated by the motors 210 may pass through the first resistor grid 214 and dissipate as heat. Additionally, excess electrical power is also dissipated as heat as it passes through a second resistor grid 218, which is arranged to receive electrical power via a chopper circuit 220. The chopper circuit 220 operates to selectively route a portion of the developed electrical power through the second resistor grid 218. One embodiment for the drive and retard system is described in more detail below.

Figure 3:
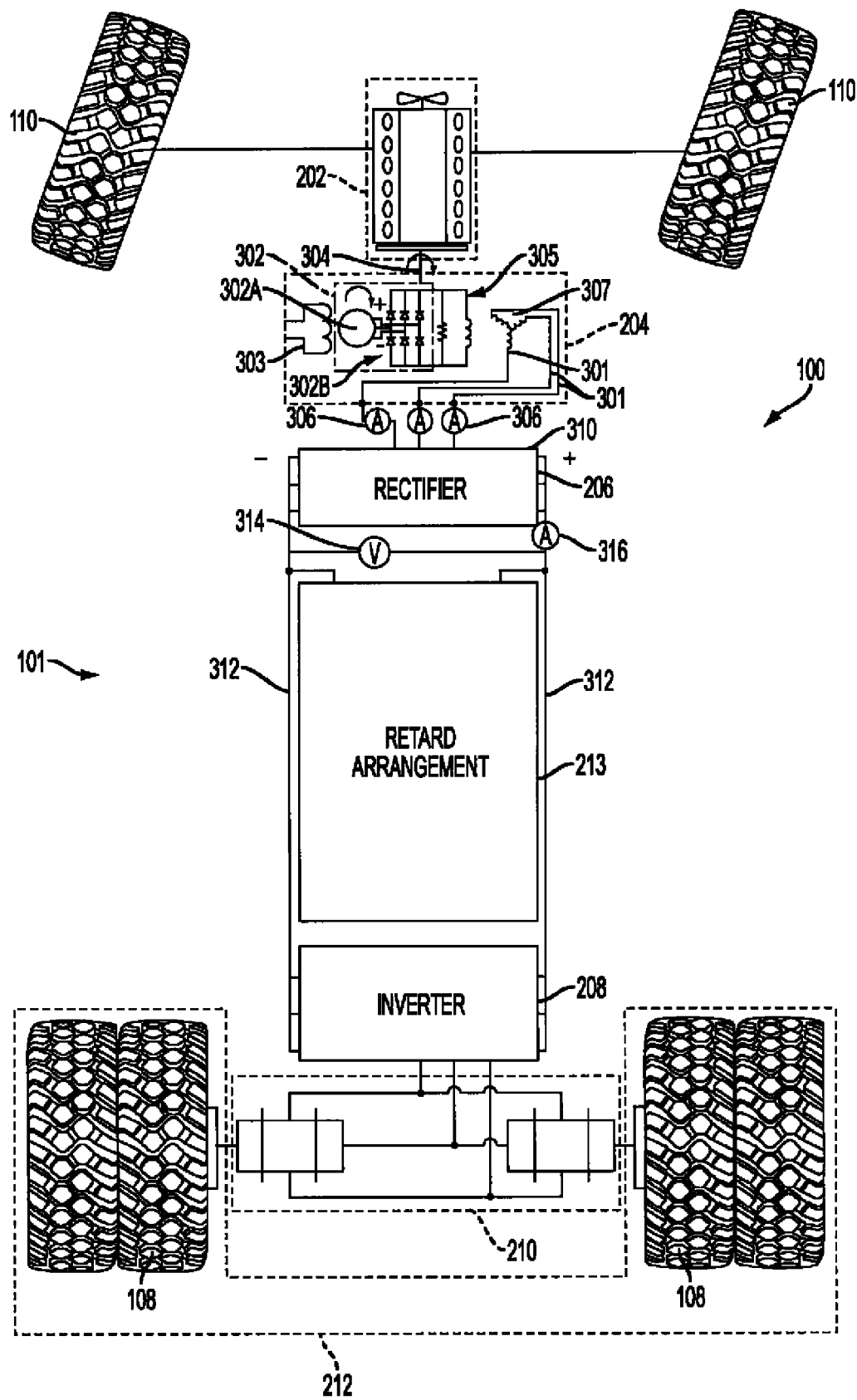
FIG. 3 is another block diagram representation of a drive and retard system in which the disclosure may be deployed.
Figure 4:
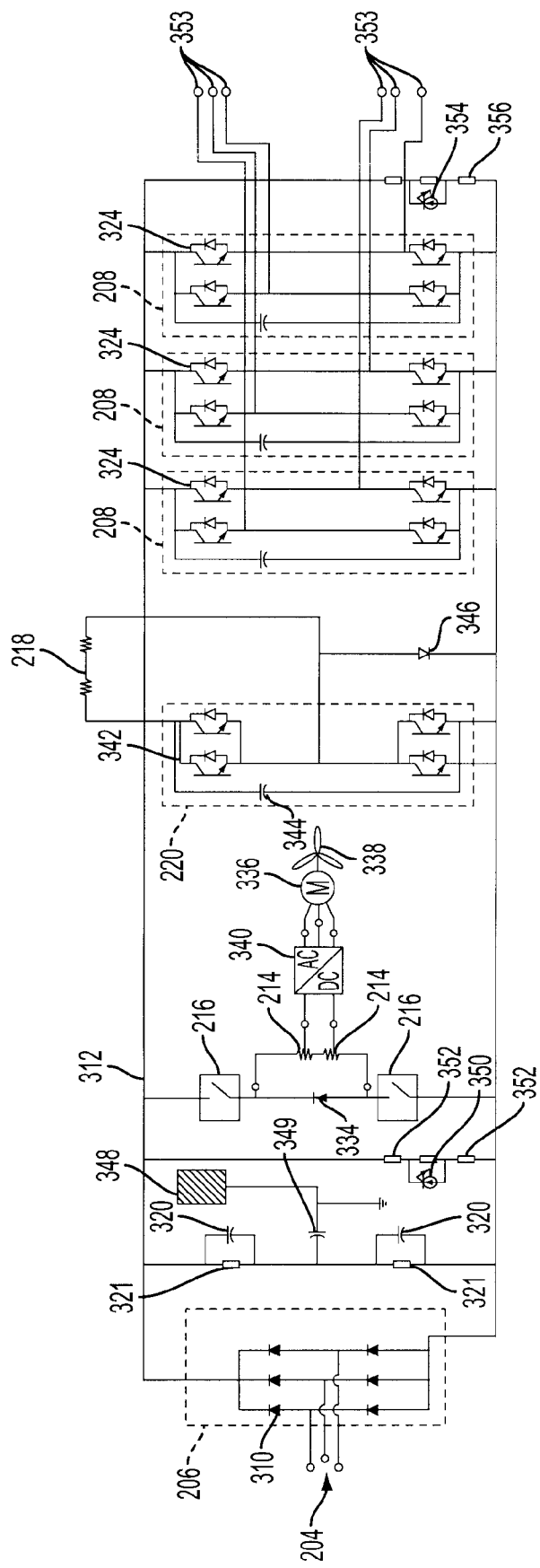
FIG. 4 is a simplified electrical circuit diagram for the power circuit used in the drive and retard system shown in FIG. 3.

A block diagram of the direct series electric drive system of the off-highway truck 101, as one example for the machine 100, is shown in FIG. 3 and FIG. 4. In these views, elements that were previously described are denoted by the same reference numerals for the sake of simplicity. Further, the block diagram of FIG. 4 includes a particular embodiment with component examples that can be included in the functional blocks shown in FIG. 3. Hence, the block diagrams shown in FIG. 3 and FIG. 4 should be referred to together when considering the description that follows. As shown, the engine 202 is connected to the generator 204 (shown in FIG. 3) via an output drive shaft 304. Even though a direct connection to the output drive shaft 304 is shown, other drive components, such as a transmission or other gear arrangements, may be utilized to couple the output of the engine 202 to the generator 204. The generator 204 may be any appropriate type of generator or alternator known in the power generation art.

In one embodiment, the generator 204 is a three-phase alternating current (AC) synchronous generator having a brushless, wound rotor. The generator 204 has an output 301 for each of three phases of alternating current being generated, with each output having a respective current transducer 306 connected thereto. The rotor of the generator 204 (shown in FIG. 3) includes a rotating rectifier 302 that is connected to a rotating exciter armature 302A. The rotating exciter armature 302A is energized by an excitation field produced by an excitation winding 303. Thus, the application of an excitation signal at the input to the excitation winding 303 creates an excitation field to activate the generator field 305. The generator field 305, in turn, produces the output available at three leads of the armature 307 of the generator 204.

In the illustrated embodiment, the rotating rectifier 302 includes a rotating exciter armature 302A that is connected to an array of rotating diodes 302B. The three current outputs of the generator 204, which are collectively considered the output of the generator 204, are connected to a rectifier 206. If one of the arrays of rotating diodes 302B fails, a greater current is required to develop a given voltage. Thus, the direct series electric drive system tends to operate less efficiently when such a malfunction occurs.

The rectifier 206 converts the AC power supplied by the generator 204 into DC power. Any type of rectifier 206 may be used. The rectifier 206 converts the AC power supplied by the generator 204 into DC power. Any type of rectifier 206 may be used. In the example shown, the rectifier 206 is a poly-phase diode bridge, and in particular is a three phase full bridge rectifier 206. The illustrated rectifier 206 includes three parallel pairs of power diodes 310, each pair being associated with a given phase of the output of the generator 204. Each such diode pair includes two power diodes 310 connected in series across the DC link 312, with the selected output of the generator 204 providing a power input between each pair.

When power is supplied from the output of the three phase generator 204, the rectifier 206 operates to provide full wave rectification of each of the phases of the three-phase alternating current. The rectifier 206 develops a voltage across a DC linkage or DC link 312. This DC link voltage is available at a first rail and a second rail of the DC link 312. The first rail is typically at a first voltage and the second rail is typically at a second voltage during operation. Either of the first and second voltages may be zero.

During operation, a voltage is developed across the first and second rails of the DC link 312 by the rectifier 206 and/or an inverter circuit 208. One or more capacitors 320 may be connected in parallel with one or more resistors 321 across the DC link 312 to smooth the voltage V across the first and second rails of the DC link 312. The DC link 312 exhibits a DC link voltage, V, which can be measured by a voltage transducer 314, and a current, A, which can be measured by a current transducer 316, as shown in FIG. 3.

The inverter circuit 208 is connected in parallel with the rectifier 206 and operates to transform the DC voltage V into variable frequency sinusoidal or non-sinusoidal AC power that drives, in this example, two drive motors 210 (FIG. 3). Any known inverter may be used for the arrangement of the inverter circuit 208. In the example shown in FIG. 4, the inverter circuit 208 includes three phase arrays of insulated-gate bipolar transistors (IGBT) 324 that are arranged in transistor pairs and that are configured to supply a 3-phase AC output to each drive motor 210.

The inverter circuit 208 can control the speed of the motors 210 by controlling the frequency and/or the pulse-width of the AC output. The drive motors 210 may be directly connected to the drive wheels 108 or may power the final drives that power the drive wheels 212. Final drives, as is known, operate to reduce the rate of rotation and increase the torque between each drive motor 210 and each set of drive wheels 212.

In alternative embodiments, the engine 202 and generator 204 are not required to supply the power necessary to drive the drive motors 210. Instead, such alternative embodiments use another source of power, such as a battery or contact with an electrified rail or cable. In some embodiments, one drive motor 210 may be used to power all drive wheels of the machine, while in other embodiments, any number of drive motors may be used to power any number of drive wheels, including all wheels connected to the machine.

Returning now to the block diagrams of FIG. 3 and FIG. 4, when the machine 100 operates in an electric braking mode, which is also known as electric retarding, less power is supplied from the generator 204 to the DC link 312. Because the machine is travelling at some non-zero speed, rotation of the drive wheels 108 due to the kinetic energy of the machine 100 will power the drive motors 210. The drive motors 210, in this mode, act as generators by producing AC electrical power. Consumption or disposition of this electrical power will consume work and act to apply a counter-rotational torque on the drive wheels 108, causing them to reduce their rotational speed, thus retarding the machine.

The generated AC electrical power can be converted into DC electrical power through the inverter circuit 208 for eventual consumption or disposition, for example, in the form of heat. In an illustrated embodiment, a retarder arrangement 213 consumes such electrical power generated during retarding. The retarder arrangement 213 can include any suitable arrangement that will operate to dissipate electrical power during retarding of the machine. In the exemplary embodiments shown in FIG. 4, the retarder arrangement 213 includes a first resistor grid 214 that is arranged to dissipate electrical energy at a fixed rate. The retarder arrangement 213 also includes a second resistor grid 218, to which DC current is supplied at a selectively variable rate by use of a pulse width modulator (PWM) or chopper circuit 220. In this way, the second resistor grid 218 dissipates electrical energy at a variable rate.

When the machine 100 is to operate in a retarding mode, the first resistor grid 214 is connected between the first and second rails of the DC link 312 so that current may be passed therethrough. When the machine 100 is being propelled, however, the first resistor grid 214 is electrically isolated from the DC link 312 by two contractors or bipolar automatic switches (BAS) 216. Each BAS 216 may include a pair of electrical contacts that are closed by an actuating mechanism, for example, a solenoid (not shown) or a coil creating a magnetic force that attracts the electric contacts to a closed position. The BAS 216 may include appropriate electrical shielding and anti-spark features that can allow these items to operate repeatedly in a high voltage environment.

When the machine 100 initiates retarding, it is desirable to close both BAS 216 within a relatively short period such that the first resistor grid 214 is placed in circuit between the first and second DC rails to begin energy dissipation rapidly. Simultaneous actuation or actuation at about the same time, such as, within a few milliseconds, of the pair of BAS 216 may also advantageously avoid charging the first resistor grid 214 and other circuit elements to the voltage present at the rails of the DC link 312. The pair of BAS 216 also prevents exposure of each of the BAS 216 or other components in the system to a large voltage difference (the voltage difference across the DC link 312) for a prolonged period. A diode 334 may be disposed in parallel to the first resistor grid 214 to reduce arcing across the BAS 216, which also electrically isolate the first resistor grid 214 from the DC link 312 during a propel mode of operation.

When the machine 100 is retarding, a large amount of heat can be produced by the first resistor grid 214. Such energy, when converted to heat, must be removed from the first resistor grid 214 to avoid an overheating condition. For this reason, a blower 338, driven by a motor 336, operates to convectively cool the first resistor grid 214. There are a number of different alternatives available for generating the power to drive the motor 336. In this embodiment, a DC/AC inverter 340 is arranged to draw power from voltage-regulated locations across a portion of the first resistor grid 214. The DC/AC inverter 340 may advantageously convert DC power from the DC link 312 to 3-phase AC power that drives the motor 336 when voltage is applied to the first resistor grid 214 during retarding.

In the illustrated embodiment, the BAS 216 are not arranged modulate the amount of energy that is dissipated through the first resistor grid 214. During retarding, however, the machine 100 may have different energy dissipation requirements. This is because, among other things, the voltage V in the DC link 312 should be controlled to be within a predetermined range. To meet such dissipation requirements, the second resistor grid 218 can be exposed to a controlled current during retarding through action of the chopper circuit 220. The chopper circuit 220 may have any appropriate configuration that will allow modulation of the current supplied to the second resistor grid 218. In this embodiment, the chopper circuit 220 includes an arrangement of transistors 342 that can, when actuated according to a desired frequency and/or duration, modulate the current passed to the second resistor grid 218. This controls the amount of energy dissipated by the second resistor grid 218 during retarding. The chopper circuit 220 may additionally include a capacitor 344 that is disposed between the first and second rails of the DC link 312 and that regulates the voltage input to the chopper circuit 220. A switched diode 346 may be connected between the second resistor grid 218 and the DC link 312 to protect against short circuit conditions in the DC link 312 and to provide a device that can deactivate the DC link 312, for example, during service.

The passage of current through the second resistor grid 218 will also generate heat, necessitating cooling of the second resistor grid 218. In this embodiment, the first and second resistor grids 214 and 218 may both be located within the blower housing 116 (also shown in FIG. 1A and FIG. 2) for convective cooling when the motor 336 and blower 338 are active.

The embodiment for a drive system shown in FIG. 4 includes other components that are discussed for the sake of completeness. Such components are optional but are shown herein because they promote smooth and efficient operation of the drive system. In this exemplary embodiment, a leakage detector 348 is connected between the two resistors 321, in series with a capacitor 349, to the first and second rails of the DC link 312. The leakage detector 348 detects any current leakage to ground from either of the first and second rails of the DC link 312. Further, in one embodiment, a first voltage indicator 350 may be connected between resistors 352 across the first and second rails of the DC link 312. The first voltage indicator 350 may be disposed between the rectifier 206 and the retarder arrangement 213 such that a high voltage condition may be detected. In a similar fashion, a second voltage indicator 354 may be connected between resistors 356 across the first and second rails of the DC link 312. The second voltage indicator 354 may be disposed between connection nodes 353 that connect to the drive motors 210 and the inverter circuit 208 to detect a voltage condition occurring during, for example, a bus bar fracture where the DC link 312 is not continuous, in order to diagnose whether the inverter circuit 208 is operating.

Figure 5:
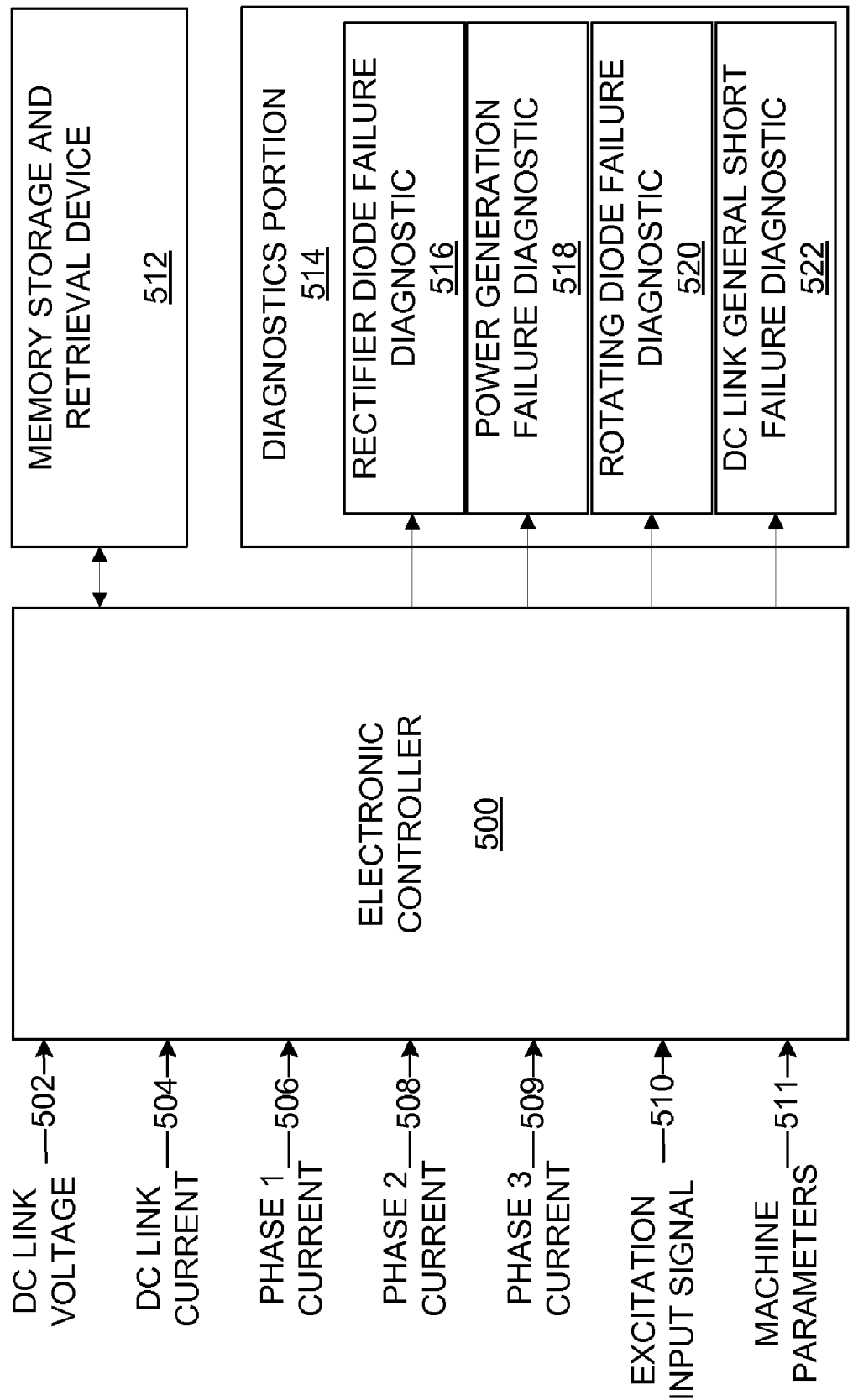
FIG. 5 is a block diagram illustrating various connections between a controller and various components of an electric drive system in accordance with the disclosure.

A block diagram for an electronic controller for use in the drive system of an electric drive machine is shown in FIG. 5. The electronic controller may be a single controller or may include more than one controller disposed to control various functions and/or features of a machine. For example, a master controller, used to control the overall operation and function of the machine, may be cooperatively implemented with a motor or engine controller, used to control the engine 202. In this embodiment, the term "controller" is meant to include one, two, or more controllers that may be associated with the machine 100 and that may cooperate in controlling various functions and operations of the machine 100 (FIG. 1). The functionality of the controller, while shown conceptually in FIG. 5 to include various discrete functions for illustrative purposes only, may be implemented in hardware and/or software without regard to the discrete functionality shown. Accordingly, various interfaces of the controller are described relative to components of the drive system shown in the block diagram of FIG. 3. Such interfaces are not intended to limit the type and number of components that are connected, nor the number of controllers that are described.

In FIG. 5, a controller 500, which can be an electronic controller, is disposed to receive a voltage signal provided at a node 502, which voltage signal is indicative of the instantaneous DC voltage present at the DC link 312 (FIG. 3). The voltage transducer 314, for example, measures this value. In a similar fashion, the controller 500 receives a current signal provided at a second node 504, which is indicative of the current passing through the DC link 312 (FIG. 3). The current transducer 316 (see FIG. 3), for example, measures this value. Additionally, the controller 500 is disposed to receive three phase current signals provided, one each, at a third node 506, a fourth node 508, and a fifth node 509, respectively. The current transducers 306, for example, may each measure these values. In one embodiment, the three phase current signals provided may have an adequately small resolution such that the current transducers used to measure such currents may have a relatively quick response time, for example, a resolution of a few milliseconds. Such resolution can enable the electronic controller 500 to discern the magnitudes of the currents passing through each of the three outputs 301 of the generator 204 (FIG. 4). In addition, the controller 500 may be capable of discerning the waveform shape. For example, each of the waveforms may be expected to have a sinusoidal waveform in each of the current signals. Based on such data, the controller 500 may determine the instantaneous phase angle of each of the three currents during operation.

The controller 500 may further receive information concerning the operation of the electric drive system of the machine 100. For example, in the embodiment of FIG. 4, the generator 204 operates under the control of an excitation signal applied to the excitation winding 303. The controller 500 may monitor the excitation signal applied to the excitation winding 303 at a sixth node 510. The electronic controller 500 may also receive information indicative of engine operating parameters. Such engine parameters may include engine speed, engine load, torque output, the presence of engine faults, or other parameters that concern the operating state of the engine. Such engine parameters may be available for the electronic controller at a seventh node 511.

The electronic controller 500 may operate in a logical fashion to perform operations, execute control algorithms, store and retrieve data, and so forth. In this embodiment, the electronic controller 500 may access a memory storage and retrieval device 512 that contains, for example, one or more tables (or other appropriate data organization) containing addressable elements of data. The memory storage and retrieval device 512 may be in the form of read only memory (ROM) or random access memory (RAM) or integrated circuitry that is accessible by the electronic controller 500, or integrated therewith.

In addition to its function of controlling various components and/or systems of the machine 100, the electronic controller 500 may further be disposed to diagnose fault conditions of various components and systems. More specifically, the electronic controller 500 may continuously monitor various operating parameters of the machine 100, compare them to respective expected values, and diagnose failures or fault conditions in various systems of the machine when the monitored parameters, or sets of parameters, diverge from expected values. In one embodiment, the electronic controller 500 may perform diagnostic operations when the machine is first started, or idle, such that various operating parameters are repeatable and stable. For example, various diagnostic operations may be performed when the electric drive system of the machine is operating and in an idle condition. An idle condition is meant to encompass any operating mode of the machine during which generator is operating but there is no power or very little electrical power being consumed. In such a condition, fault conditions may be detected by the electronic controller 500 and stored within the memory storage and retrieval device 512 for later retrieval and inspection by service personnel. These fault indications may be in the form of single bit data elements that, for example, are set at a zero value when no fault has been detected, and changed to a value of one when a fault has been detected. Other data values or variable types may also be used.

In one embodiment, the electronic controller 500 may include a register of diagnostic codes or a diagnostics portion 514. The diagnostics portion 514 includes a plurality of fault flags corresponding to certain malfunction or fault conditions detected by the electronic controller 500. These fault flags may include a rectifier diode failure diagnostic flag 516, a power generation failure diagnostic flag 518, a rotating diode diagnostic failure diagnostic flag 520, a DC link general short failure diagnostic flag 522, and others. These failure diagnostic flags 516, 518, 520, and 522, may represent values that may be selectively changed by one or more control algorithms operating within the electronic controller 500 and whose values may be stored in the RAM of the electronic controller 500 for later retrieval or inspection by service personnel.

Figure 6:
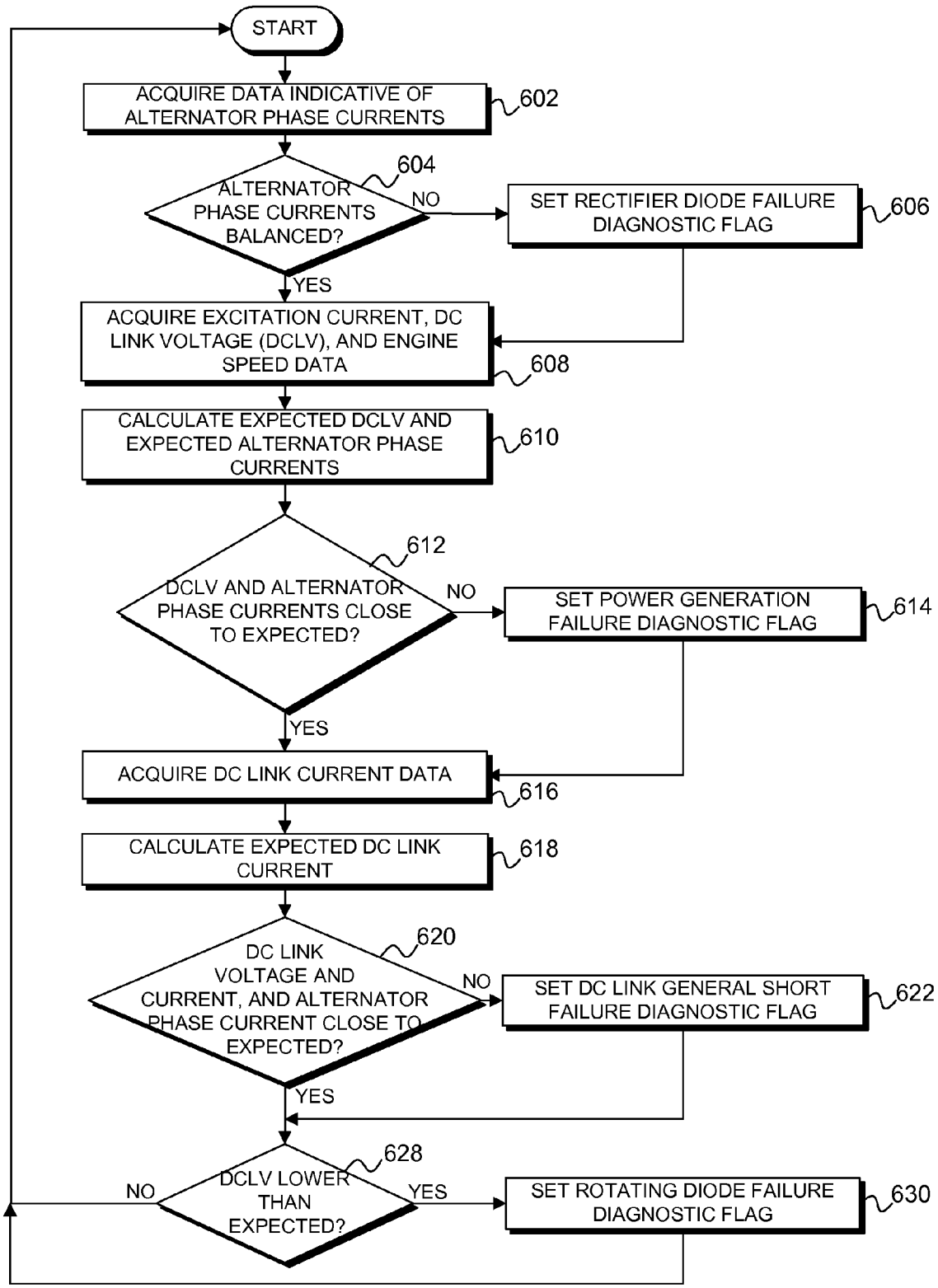
FIG. 6 is a flowchart for a method for determining the operating condition of rotating diodes in a generator associated with an electric drive system in accordance with the disclosure.

FIG. 6 is a flowchart for a method of diagnosing failures in various components of an electric drive system. The operations described below relative to the flowchart presented are operations that may be performed by the electronic controller 500 shown in FIG. 5 in accordance with appropriate control algorithms being executed therein. That is, the disclosed process may be executed by an electronic controller via the execution of computer-executable instructions, e.g., in machine language form or otherwise, read from a computer-readable medium, e.g., a magnetic or optical disc or other tangible medium. While the methodology is described with reference to the electronic controller 500 shown in FIG. 5, the method is applicable to any controller that monitors the operation of a system to diagnose a fault condition in one or more components of the system. Also, while a particular sequence is shown for convenience, the disclosure is applicable to diagnosing failures according to different steps as well.

Accordingly, the electronic controller 500 may acquire or receive data or signals indicative of alternator phase currents at a first stage 602. The electronic controller 500 may determine at a first decision stage 604 whether the alternator phase currents are balanced by considering, for example, the phase, shape, and magnitude of each phase current signal. When each of the current outputs of each phase of the alternator is balanced with the other phases, the controller 500 determines that the diodes 310 comprising the rectifier circuit 206 (FIG. 4) are properly operating.

A common failure mode for a rectifier diode, such as the diode 310 shown in FIG. 4, is the inability to prevent current flow in a reverse-bias condition, essentially creating a short circuit on the respective leg of the rectifier circuit. Such a failure of one of the diodes in the rectifier circuit 206 that converts 3-phase AC power to DC power, such as the rectifier circuit 206 shown in FIG. 4, permits current in one of the legs of the rectifier circuit 206 to flow back through the output winding of the generator 204. That is, other phase currents output through the remaining legs of the rectifier circuit 206 will flow back through the short circuit created by the failed diode. If unabated, the circulating current resulting from such a diode failure may cause damage to the secondary winding or armature 307 of the generator, or even a more catastrophic failure to the generator 204. In any event, this failure condition causes a phase imbalance of the 3-phase current output from the generator 204.

Specifically, because the sum of the phase currents is zero, current flowing through the rectifier leg having a failed diode will increase while the currents flowing in the remaining legs will decrease. The phase currents will also transition from an AC current to a DC current. In an embodiment, the controller 500 calculates the RMS values of each of the 3-phases and then compares the ratio of the RMS values of the phases. When the ratio exceeds a threshold, such as when the ratio between a first phase and a second phase is, for example, greater than 1.2 (or less than 0.8), the controller 500 determines that one of the current phases is unbalanced. This determination may be indicative that one of the diode legs of the rectifier circuit has malfunctioned. Alternatively, or in addition, the controller 500 may attempt to isolate the particular diode that has failed. To perform such diagnosis, the controller 500 may determine in which of the legs of the rectifier current flow is in an opposite direction as compared to the remaining legs. The controller 500 may perform other permutations of the three phase currents to make this determination.

If the controller 500 determines at the first decision stage 604 that the phase current in one of the rectifier legs is unbalanced with respect to the other phase currents, the controller 500 activates a rectifier diode failure diagnostic flag at a second processing stage 606. Processing then continues to a next processing stage 608.

On the other hand, if the alternator phase currents are balanced, the method also proceeds to the third processing stage 608 and acquires the excitation signal value(s) with respect to the generator, the engine speed, and the voltage present across the DC link (DCLV). Specifically, the controller 500 obtains the voltage signal provided at node 502 (FIG. 5), which is indicative of the instantaneous DC voltage present at the DC link 312 (FIG. 3). This DC link voltage can be detected by the voltage transducer 314 (FIG. 3). Receipt of such data by the controller 500 may be performed either before or after the controller 500 sets the rectifier diode failure diagnostic flag at the second processing stage 606. Because an expected generator output may be derived from these variables, the controller 500 may use such information as engine speed, excitation voltage or current, and the DCLV to diagnose various failures of components disposed between the engine and the DC link. For example, the controller may determine that the excitation signal received at the sixth node 510 is not present, or differs from an expected excitation signal supplied to the generator. The controller 500 in this case may set an appropriate flag indicating that a cable has likely been disconnected.

The controller 500 may also determine that the engine speed, DCLV, and/or the excitation current do not correspond to the output current supplied by the generator. Specifically, as shown in FIG. 6, the controller 500 may calculate at a fourth processing stage 610 theoretical or expected DCLV and phase current values that should be present at the output of the generator and the rectifier 206 (FIG. 4). For example, the controller 500 may calculate or otherwise determine the expected phase current values based on the engine speed and excitation signal. Alternatively or in addition, the controller 500 may process the acquired alternator phase current to determine an expected engine speed. This may be performed through a Fast Fourier Transform (FFT) or may involve other suitable processes. The determination at the fourth processing stage 610 may be performed by use of a function or model of the generator, or use of tabulated generator operating parameters based on input parameters to the generator, such as engine speed and excitation current, and so forth.

The controller 500 may compare the value for the DCLV acquired with the expected DCLV determined at the fourth processing stage 610. A relatively large divergence, for example, 30% or more, exists between the acquired and the expected DCLV values, the controller 500 may determine that one of at least two potential fault conditions may be present. The first fault condition may be a failure in the power generation system, for example, the generator. The second fault condition may be a current leakage or other short circuit condition, which may be caused by failure of one of the components that are connected to the DC link 312 (FIG. 3). To distinguish among possible fault conditions, the controller 500 may further compare the phase current data acquired at the first processing stage 602 with the expected phase current data calculated at the fourth processing stage 610 to determine at a second decision stage 612 which of these fault conditions exists. The determinations at the second decision stage 612 may include calculating a difference between an actual value and a theoretical value, and comparing the difference to a threshold difference, or any other appropriate comparison method. If the determination at the second decision stage 612 indicates that the actual performance of the generator has diverged from the expected performance thereof, a power generation failure diagnostic flag is set at a fifth processing stage 614. If the determination indicates that the alternator phase currents are present and balanced, then a current leakage or short circuit may be present. The method then proceeds to a sixth processing stage 616.

At the sixth processing stage 616, the controller 500 acquires the DC link current. The controller 500 obtains the signal available at the second node 504 (FIG. 5). As explained above, this signal is indicative of the current passing through the DC link 312 (FIG. 3).

The method then proceeds to a seventh processing stage 618 at which the controller 500 determines theoretical or expected value of the DC link current. These theoretical values may depend on the drive condition of the system and various operator inputs, and indicate the current that should be present at the DC link under normal operating conditions. The expected DC link current values may be directly calculated by the controller 500 based on parameters that are available. These may include the engine speed, the excitation signal, and so forth. Alternatively, the expected DC link current values may be extrapolated from tabulated data.

The method proceeds to a third decision stage 620 and compares the DC link expected voltage and current, as well as the expected alternator phase current, with the respective measured parameters of DC link current and voltage, along with the expected alternator phase currents. This comparison may be performed according to any appropriate method. In one embodiment, the controller may calculate a respective difference between each measured and theoretical parameters, and compare each difference to a threshold value. Under conditions where a respective difference exceeds a threshold, meaning that the voltage or current in the DC link has sufficiently diverged from its expected value, and the alternator phase currents are close to their expected values, a DC link general short failure diagnostic flag may be set at an eighth processing stage 622.

A short circuit of the DC link may result from failure of both diodes of a leg in the rectifier circuit 206. In this case or in another instance of the presence of a short circuit in the DC link, the DC link voltage will decrease, while the phase current output by the generator 204 is likely to increase. At the same time, no current will be present in a portion of the DC link that is separated from a current transducer by the short circuit. If unabated, this condition may reduce the life of the capacitor 344, or may even bend the physical conductors comprising the DC link.

The electronic controller 500 may compare at a fourth stage 628 the actual DC link voltage acquired at the third processing stage 608 with the expected DC link voltage calculated at the at the fourth processing stage 610. This comparison may be accomplished by any appropriate method. In one embodiment, a difference between the actual and theoretical values of the DC link voltage may be calculated. The magnitude of this difference may be compared to a threshold value to determine the variance between the two values. Regardless of the comparison method used, the controller 500 sets a rotating diode failure diagnostic flag at an eleventh processing stage 630 based on a determination, at the fourth decision stage 628, that the actual DC link voltage is less than the theoretical DC link voltage, and/or the variance is greater than an allowable tolerance, for example, 5-10% lower than the expected DC link voltage. Such difference may increase if more than one rotating diodes have failed.

Setting the rotating diode failure diagnostic flag at the eleventh processing stage 630 when the actual or measured voltage at the DC link is sufficiently different than the expected voltage is based on an assumption that the generator is operating inefficiently. Such a failure is different than the general power generation failure that may be detected at the second decision stage 612. In this instance, the generator may be operating to produce balanced phase currents at its output, but an internal failure of a rotating diode will cause the magnitudes of the current outputs, and therefore the power conversion efficiency of the generator, to decrease. Whether or not a diagnostic flag is set at the eleventh processing stage 630, method then returns to the beginning and continues.

In an alternative embodiment, the electronic controller 500 may monitor for failures occurring in the rotating diodes by use of an energy or power determination. In such alternative embodiment, an energy balance calculation may be used to determine a theoretical electrical power output from the generator. The theoretical power output may be equal to the difference between the power input to the generator, in the form of mechanical power from the prime mover, the power conversion efficiency of the generator, and any losses of the system. The power input to the generator may be determined based on the speed and torque output of the engine driving the generator at any time. The power conversion of the generator may be a constant or variable that depends on the type of generator used and/or on the excitation signal received by the generator. The losses may depend on the temperature of the rotor bearings of the generator or any other aspects of the generator's design.

The resulting difference calculation may yield a theoretical power output for the generator, which can be compared to an actual power output of the generator. The actual power output of the generator may be determined from the electrical parameters available, for example, by considering the product between the DC link voltage and current. A deviation between the actual and theoretical power outputs of the generator may indicate that a rotating diode has failed.

INDUSTRIAL APPLICABILITY

The industrial applicability of the methods and systems for determining the operating condition of one or more rotating diodes in a generator as described herein should be readily appreciated from the foregoing discussion. The present disclosure may be included as part of an overall diagnostic scheme that monitors the operating condition of various circuit components in an electric drive system. That is, the diagnostic flags and/or alerts that are provided as a result of detecting a difference between expected and actual values may include the storage of diagnostic codes in memory that are later read out. Such diagnostic codes may take many different forms. For example, other operating data concerning the equipment and the time of the creation of the code or codes may also be stored and available for diagnosis. This arrangement is particularly suited for systems in which the number of available transducers is limited.

The disclosure, therefore, is applicable to many machines and many environments. One exemplary machine suited to the disclosure is an off-highway truck. Exemplary off-highway trucks are commonly used in mines, construction sites, and quarries. Entities that use these off-highway trucks often sustain significant monetary losses for unscheduled times that an off-highway truck is inoperable or is not operating at peak efficiency, as other operations may also be placed behind schedule.

Off-highway trucks, particularly those adapted to use electric, hybrid, or direct series electric drive systems, may require time-consuming processes to determine the source of a malfunction. Furthermore, it can often be difficult to determine with any certainty that such machines are functioning sub-optimally. Thus, a method and system that can reduce the amount of time that an off-highway truck is inoperable or is operating sub-optimally can save significant expenditures.

Further, the methods and systems described above can be adapted to a large variety of machines and tasks. For example, other types of industrial machines, such as backhoe loaders, compactors, feller bunchers, forest machines, industrial loaders, skid steer loaders, wheel loaders and many other machines can benefit from the methods and systems described.

It will be appreciated that the foregoing description provides examples of the disclosed system and technique. However, it is contemplated that other implementations of the disclosure may differ in detail from the foregoing examples. All references to the disclosure or examples thereof are intended to reference the particular example being discussed at that point and are not intended to imply any limitation as to the scope of the disclosure more generally. All language of distinction and disparagement with respect to certain features is intended to indicate a lack of preference for those features, but not to exclude such from the scope of the disclosure entirely unless otherwise indicated.

Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context.

Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

The invention claimed is:

1. A method for diagnosing a power generation failure for a power circuit in an electric drive coupled with a prime mover, the power circuit including a rectifier circuit coupled with a power generator and disposed to provide a DC output voltage across a DC link, the method comprising:
   receiving at least one power generator input;
   receiving at least one machine parameter associated with the prime mover;
   receiving a set of diagnostic values associated with the DC link and the at least one power generator input;
   determining a set of expected operating values based on the at least one power generator input and the at least one machine parameter, the set of expected operating values corresponding to the received set of diagnostic values;
   comparing each diagnostic value from the set of diagnostic values to a corresponding expected operating value from the set of expected operating values to determine a difference for each diagnostic value; and
   setting an indicator flag that a power generation failure exists if the difference between one or more diagnostic values and a corresponding one or more expected values exceeds a threshold;
   wherein the power generator is a multi-phase alternating current (AC) synchronous generator having a rotating input coupled with a prime mover output, an input winding disposed to receive an excitation signal as the at least one power generator input, an output winding magnetically coupled with the input winding and disposed to provide a set of alternator phase currents to the rectifier circuit, wherein each phase current comprises one of the diagnostic values associated with the DC link.

2. The method of claim 1, wherein the at least one machine parameter includes a prime mover output speed.

3. The method of claim 2, wherein the set of diagnostic values associated with the DC link includes a DC link voltage developed across the DC link.

4. The method of claim 3 wherein the diagnostic flag is set when the DC link voltage is less than an expected DC link voltage and the alternator phase current is less than an expected alternator phase current.

5. The method of claim 4 further including the step of providing an alert in response to setting the indicator flag that specifies the power generation failure.

6. The method of claim 5 wherein the step of providing the alert includes activating a visual indicator.

7. The method of claim 4, further comprising setting a second indicator flag if the DC link voltage is less than an expected DC link voltage and the alternator phase current is about the same as an expected alternator phase current.

8. A controller disposed to monitor whether a power generation failure has occurred in a power circuit of an electric drive system in a machine that includes a prime mover disposed to provide an output to a power generator, a rectifier circuit coupled with the output of the power generator, and a direct current (DC) link disposed in circuit with the rectifier, the controller comprising:
    an input receiving portion configured to receive a set of diagnostic values relating to engine parameters associated with the prime mover, a set of diagnostic values associated with the power generator inputs, and a set of diagnostic values associated with the DC link;
    a determination portion configured to determine, based on the set of power generator inputs and the set of machine parameters, a set of expected operating values corresponding to the set of diagnostic value;
    a comparison portion configured to compare each of the diagnostic values for the set of diagnostic values to a corresponding expected operating value from the set of expected operating values to determine a set of differences;
    a logic portion configured to determine whether a power generation failure condition has occurred based on the set of differences; and
    an indicator portion configured to set a flag when the power generation failure has been determined;
    wherein the power generator is a multi-phase alternating current (AC) synchronous generator having a rotating input coupled with a prime mover output, an input winding disposed to receive an excitation signal, an output winding magnetically coupled with the input winding and disposed to provide a set of alternator phase currents to the rectifier circuit, wherein each phase current from the set of alternator phase currents is associated with a different phase value.

9. The controller apparatus of claim 8, wherein the set of diagnostic values relating to engine parameters associated with the engine includes a prime mover output speed.

10. The controller apparatus of claim 9, wherein the set of diagnostic values associated with the power generator inputs includes an excitation value developed at the power generator input winding.

11. The controller apparatus of claim 10, wherein the set of diagnostic values associated with the DC link includes a DC link voltage developed across the DC link.

12. The controller of claim 11, wherein the logic portion is configured to indicate a power generation failure when the DC link voltage developed across the DC link is less than an expected DC link voltage and at least one of the alternator phase currents is less than an expected alternator phase current.

13. The controller of claim 8, wherein the logic portion is further configured to set a second indicator flag if the DC link voltage developed across the DC link is less than an expected DC link voltage and at least one of the alternator phase currents is about the same as an expected alternator phase current.

14. The controller of claim 8, further including an alert portion responsive to the indicator portion and being configured to activate a visual indicator associated with the controller when the power generation failure condition has been determined.

15. A system including a power generator associated with an electric drive system in a machine including a prime mover disposed to provide an output coupled with the power generator, the system comprising:
    a rectifier circuit coupled to an output of the power generator;
    a DC link coupled to the rectifier circuit having a DC link voltage defined between a first DC rail and a second DC rail; and
    a controller configured to receive a set of generator inputs, a set of machine parameters associated with the machine, and a set of diagnostic values associated with the power generator and the DC link, the controller being further configured to determine a set of expected operating values for the power generator and of the DC link, to compare the set of diagnostic values with the set of expected values, and to set a flag indicating a power generation failure condition when the comparison exceeds a threshold;
    wherein the power generator is a multi-phase alternating current (AC) synchronous generator having a input coupled with the output of the prime mover, an input winding disposed to provide at least one of the set of diagnostic values associated with the generator, an output winding magnetically coupled with the input winding and disposed to provide a set of alternator phase currents to the rectifier circuit, and wherein the set of diagnostic values associated with the generator includes the set of alternator phase currents.

16. The system of claim 15, wherein the set of machine parameters includes a prime mover output speed.

17. The system of claim 15 further comprising:
    an inverter circuit coupled with the DC link;
    an output drive coupled with the inverter circuit; and
    a retard circuit coupled with the DC link, the inverter circuit, and the output drive and disposed to dissipate retard energy supplied by the output drive through the inverter circuit during a retard mode of operation.

* * * * *